Nov. 8, 1960 R. N. NOYCE 2,959,681

SEMICONDUCTOR SCANNING DEVICE

Filed June 18, 1959 4 Sheets-Sheet 1

INVENTOR.
ROBERT N. NOYCE
BY Lippincott & Ralls
ATTORNEYS

INVENTOR.
ROBERT N. NOYCE
BY Lippincott & Ralls
ATTORNEYS

INVENTOR.
ROBERT N. NOYCE
BY Lippincott & Ralls
ATTORNEYS

INVENTOR.
ROBERT N. NOYCE
BY Lippincott & Ralls
ATTORNEYS

United States Patent Office 2,959,681

Patented Nov. 8, 1960

2,959,681

SEMICONDUCTOR SCANNING DEVICE

Robert N. Noyce, Los Altos, Calif., assignor to Fairchild Semiconductor Corporation, Mountain View, Calif., a corporation of Delaware Filed June 18, 1959, Ser. No. 821,227

24 Claims. (Cl. 250—211)

This invention relates to a semiconductor device in which the spatial position of the current path from one surface to the other may be controlled by the application of positioning voltages, whereby electrical scanning, beam-switching, and the like are achieved in a manner analogous to a cathode-ray vacuum tube, but without the need for vacuum envelopes, electron gun structures, and other tube elements, since the beam-forming and beam-positioning actions occur within a crystal of solid semiconductor material.

The novel semiconductor scanning device provided by this invention serves as a basis for novel switching apparatus, logic and computing elements, television camera elements, television and oscillographic image-display means, and numerous other applications both similar and dissimilar to prior devices employing electron-beam vacuum tubes.

In brief, the present invention is embodied in a wide, thin plate of semiconductive material suitably treated to form a junction transistor having relatively large-area emitter and collector junctions substantially parallel to each other, with a thin base layer therebetween. Further, the transistor structure employed is one that can be operated with an over-all effective alpha greater than unity—in other words, the emitter-to-collector voltage-current characteristic has a negative-resistance region.

Various types of junction transistors are known to have the required negative-resistance characteristic, and in general any of these transistor types may be utilized in the practice of the present invention. For example, one type of negative-resistance, junction transistor is the avalanche transistor, described in the Bell System Technical Journal, volume 34 (September 1955), pp. 883–902. Another is the P-N-P-N switching transistor described in the Proceedings of the IRE, volume 44 (September 1956), pp. 1174–1182. Thus, either three-layer or four-layer transistors may be employed, the latter being particularly well suited to the present invention.

Hence, the transistor portion of the scanning device under consideration has two end layers, generally but not necessarily lying at the opposite end faces of a thin plate cut from the semiconductor crystal, and has one or more intermediate, base layers, each lying between a collector junction and an emitter junction of large lateral dimensions relative to the thickness of the transistor.

Conductive elements, e.g., electrodes, or in some cases additional semiconductor layers, are attached to the two ends of the transistor proper in electrical contact with the two end layers over major portions of their areas. These are connected to a voltage supply which forces across the collector junction reverse current sufficient to make the current gain of the transistor, alpha, exceed unity—either through avalanche multiplication as in the avalanche transistor, through the current-dependent changes in alpha which occur in the P-N-P-N transistor, or through other means.

Further, through base-layer connections hereafter described, a reverse bias is applied across the edges of an emitter junction, and the combination of negative-resistance characteristics and voltage gradients due to the flow of current through the base layer focus the emitter-to-collector current and confine it to a path of small cross-section relative to the areas of the transistor junctions. In general, if the distribution of bias voltage across the emitter junction is symmetrical outward from the center of the junction, current will flow across the junction approximately at its center.

To shift the position of the current path, a positioning voltage is applied laterally across the base layer. For example, two electrical terminals are attached to opposite edges of a base layer. When these two terminals are held at the same potential, the emitter-to-collector current is confined to a path substantially midway between them; but when a voltage is applied between these two terminals, the current path is shifted toward that side of the emitter junction having the smaller reverse bias. With four terminals attached to the base layer or layers, laterally spaced in quadrivial relation from the center, the current path can be scanned over a major portion of the areas of the junctions, and thus over the electrodes or other conductive elements attached to the end layers of the transistor. Other numbers and arrangements of the positioning terminals around the edges of the base layers are possible.

A better understanding of the invention may be had from the following description of exemplary embodiments taken in connection with the accompanying drawings. The scope of the invention is pointed out in the appended claims.

Fig. 1 of the drawings is a schematic representation illustrating the focusing and scanning principles of the invention as applied to a three-layer junction transistor;

Fig. 11 is a schematic representation of an embodiment for displaying television images and the like;

Fig. 12 is a schematic representation of another embodiment for displaying television images and the like.

Figure 1:
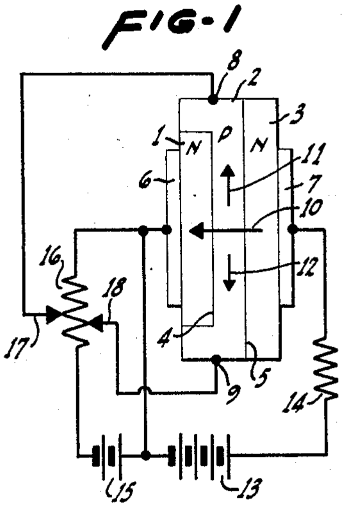

Fig. 1 is a highly schematic representation for the purpose of illustrating the focusing and positioning of the current path through a three-layer junction transistor, illustratively of the N-P-N type. The transistor itself consists essentially of a thin plate of single-crystal semiconductor material, e.g., silicon. In the drawing, the thickness of the transistor is greatly exaggerated for the purposes of illustration. In practice, the thickness will generally be no more than a few mils, whereas the lateral dimensions are relatively large—say, one-half inch square. The layers of different conductivity types are formed by any of the known processes, e.g., by diffusion.

As illustrated in Fig. 1, there are three substantially flat, parallel layers of conductivity types N and P alternately;

an N-type emitter layer 1, a P-type base layer 2, and an N-type collector layer 3. Between these layers lie the emitter junction 4 and the collector junction 5, substantially flat and parallel with each other and with each of the two large, flat, parallel, end faces of the plate of semiconductor material. Each of the two junctions has large lateral dimensions relative to the thickness of the transistor. Electrodes 6 and 7 are attached to respective ends of the transistor, and are in electrical contact with major portions of the areas of the two end layers 1 and 3. Terminals 8 and 9 are attached to opposite edges of the intermediate or base layer 2, so that voltage applied between terminals 8 and 9, as hereinafter explained, is thereby applied laterally across the base layer.

The transistor is operated with a negative-resistance emitter-to-collector characteristic—an effective alpha greater than unity—by forcing sufficient reverse current across the collector junction that avalanche multiplication of the carriers crossing the collector junction causes the collector current slightly to exceed the emitter current. Thus, a small fraction of the collector current flows out through the base terminals 8 and 9. The principal directions of current flow in the transistor are schematically illustrated by arrows 10, 11 and 12.

Negative bias voltages applied to terminals 8 and 9 provide reverse biases across the edges of the emitter junction, which tend to cut the transistor off except for the fact that current is forced across the collector junction as hereinbefore explained. Furthermore, the currents flowing through the base layer cause voltage drops therein, whereby the center of the base layer becomes appreciably more positive than the negatively biased edges. In fact, sufficient current must flow through the base layer to permit conduction at one point across the emitter layer; thereafter, the flow of the emitter current prevents a further increase in the voltage differences within the base layer and thus limits the value of the base current. What is thus achieved is a focusing or confinement of the emitter-to-collector current to a path of small cross-section relative to the areas of the emitter and collector junctions. The focusing action provided is analogous in result to beam-formation in cathode-ray and other electron-beam vacuum tubes.

If terminals 8 and 9 are held at equal potentials, the principal current path through the transistor will pass approximately across the centers of the emitter and collector junctions. On the other hand, if a voltage is applied between terminals 8 and 9, the current will be shifted laterally toward that edge of the emitter junction having the smaller reverse bias. Thus, in an N–P–N structure, the current will be shifted toward the more positive base terminal, whereas in a P–N–P structure the current would be shifted toward the more negative base terminal.

The external circuit may obviously take a variety of forms. As illustrated in Fig. 1, a substantially constant current is forced across the collector junction 5 by a constant-current source consisting, by way of example only, of a battery 13 and a resistor 14. The no-current voltage of the battery is sufficient to cause breakdown of collector junction 5, and thus insures the flow of current across the collector junction, whereas resistor 14 limits the current to a substantially constant value.

Reverse bias for the edges of the emitter junction is provided by battery 15 in series with a potentiometer 16 having two adjustable taps 17 and 18, which are connected to base-layer terminals 8 and 9 respectively. When taps 17 and 18 are adjusted to like positions on the potentiometer, terminals 8 and 9 are at equal potentials, and the emitter-to-collector current is approximately centered within the transistor. If tap 17 is moved upward, or if tap 18 is moved downward, or both, terminal 9 becomes more negative than terminal 8 and the current path is shifted toward terminal 8. Conversely, if tap 17 is moved downward, or tap 18 is moved upward, or both, the current path is shifted toward terminal 9.

It is evident that another pair of opposed terminals may be attached to the base layer for applying thereto a lateral voltage at right angles to the voltage between terminals 8 and 9. This will permit controlled, lateral movement of the current path 10 throughout a major portion of the areas of the emitter and collector junctions.

Figure 2:
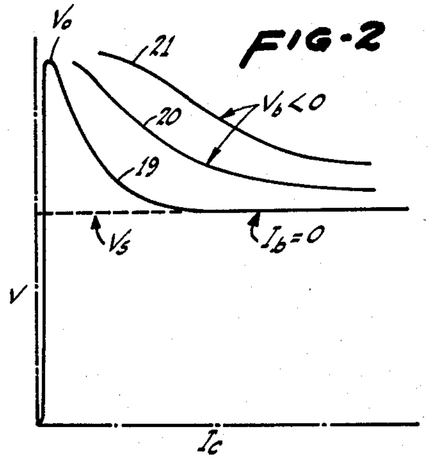
Fig. 2 is a diagram of typical voltage-current characteristics for a three-layer junction transistor.

For a further understanding of the focusing action within the transistor, reference is made to Fig. 2, which shows typical curves of the emitter-to-collector characteristic of a high-quality, N–P–N, silicon, junction transistor. In this figure, the total voltage V between the emitter and collector electrodes is plotted as a function of the collector current $I_c$.

When the base current $I_b$ is zero, the characteristic appears as represented by curve 19. This is the characteristic that would be obtained with the connections to terminals 8 and 9 removed so that no base current could flow. Under these circumstances there is very little initial current—generally, it is quite negligible—until the applied voltage reaches the breakdown voltage $V_o$. At this point avalanche multiplication of the carriers crossing the collector-junction raises the transistor alpha to unity, which permits substantial current to flow without violation of current continuity requirements. As the current increases the efficiency of the multiplication process increases, so that there follows a substantial region of negative resistance, which permits the applied voltage to drop to the sustaining voltage $V_s$. Thereafter, further increase in current results in relatively little change in the total voltage.

Considering a small lateral area wherein voltage drops within the base layer due to lateral current are negligible, curves 20 and 21 illustrate the emitter-to-collector characteristic of the same transistor with increasing reverse bias applied across the emitter junction. In each case it will be noted that there is still a considerable region of negative resistance, and it will also be noticed that a higher total voltage is required to force the same current through the transistor as the reverse bias across the emitter junction increases. Furthermore, if the emitter-to-collector voltage is only $V_s$, essentially no current can flow with reverse base bias.

In terms of the focusing action that takes place within the transistor, the curves of Fig. 2 are significant since it is apparent that the stable condition will be the one at which maximum current flows with minimum applied voltage. If the transistor of Fig. 1, with its relatively large lateral dimensions, is considered to be made up of a number of small-area transistors connected in parallel, the negative-resistance characteristic exhibited by the curves of Fig. 2 will make it clear that current will tend to increase in one of the parallel, small-area transistors at the expense of current through the others, since in this manner the greatest current flow at the lowest voltage is obtained. This in itself causes a focusing action which tends to limit the current to a relatively small area of the emitter and collector junctions.

Additionally, the current flow within the base layer, heretofore explained, causes an appreciable reverse bias to exist across all portions of the emitter layer except at the point of maximum current flow across the emitter junction. Since the current can flow through this one point of the transistor at lower voltage than it can flow through any other point, the focusing action is very effective in confining the current flow to a small cross-section.

The invention is not limited to three-layer transistors; in fact, the four-layer P–N–P–N switching transistor has certain advantages over the three-layer type—in particular, the total voltage drop across the P–N–P–N transistor in the high-current state is much lower. Also, the four-layer transistor has two base layers to which lateral positioning voltages may be applied.

Figure 3:
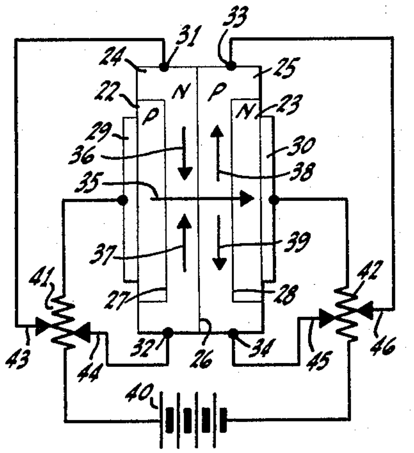
Fig. 3 is a schematic representation showing the focusing and scanning principles of the invention as applied to a four-layer transistor.

Fig. 3 is a highly schematic representation illustrating the principles of focusing and positioning the current path in a P–N–P–N switching transistor. Here again, the thickness of the transistor has been greatly exaggerated for purposes of illustration. In practice, the transistor may be formed from a thin plate of single-crystal semiconductor material—e.g., silicon—having a thickness of a few mils and lateral dimensions of, say, one-half inch square. Within the crystal, there are four consecutive, flat, parallel layers of conductivity types P and N alternately: two end layers 22 and 23 of opposite conductivity types, and two intermediate or base layers 24 and 25 of opposite conductivity types. The collector junction 26 lies between the two intermediate layers. There are two emitter junctions 27 and 28: one between each end layer and the adjacent intermediate layer. The three junctions are substantially parallel to one another and to the large, flat, parallel, end faces of the semiconductor plate. Each junction is large in area relative to the thickness of the transistor.

Electrodes 29 and 30 are attached to the two end faces of the transistor, and are in electrical contact with major portions of the end layers 22 and 23. Terminals 31 and 32 are attached to opposite edges of the intermediate or base layer 24, and terminals 33 and 34 are attached to opposite edges of the intermediate or base layer 25. It is advantageous, but not essential, that such terminals be attached to both of the two intermediate or base layers; if desired, the connections may be made to only one base layer.

Figure 4:
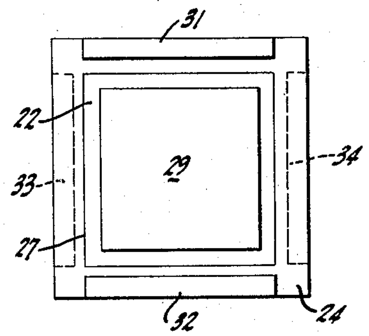
Fig. 4 is an end elevation of four-layer transistor, showing the disposition of electrodes thereon.

The preferred arrangement of the terminals is illustrated in Fig. 4, which is an end elevation of the transistor. The plate of semiconductor material is substantially square in its lateral dimensions. Layers 22 and 23, formed by the diffusion of doping substances through a mask, cover somewhat less than the whole faces of the semiconductor plate, so that the junctions 27 and 28 are shaped somewhat like shallow pans with their edges lying on the large faces of the semiconductor plate. Thus, the edges of the intermediate layers 24 and 25 are brought out to the large faces, where electrical contact can easily and conveniently be made to these base layers.

Terminals 31 and 32 are in the form of metal-film strips extending along opposite edges of the upper face throughout most of its width, so that a voltage applied between these two contacts provides a substantially uniform voltage distribution through the intermediate layer 24 to which they are attached. Contacts 33 and 34 are similarly applied to the bottom face in contact with the intermediate layer 25. The four contacts are placed outward laterally in quadrivial relation from the center of the transistor, so that the voltage applied between the terminals 31 and 32 is substantially at right angles to the voltage applied between terminals 33 and 34, whereby the current path between electrodes 29 and 30 can be moved laterally throughout substantially the entire areas of these two electrodes.

The voltage-current characteristics of the P-N-P-N transistor between terminals 29 and 30 is substantially like the characteristic illustrated in Fig. 2, except that the sustaining voltage $V_s$ is much lower, particularly in relation to the breakover voltage $V_o$. The most significant feature of both characteristics is the negative resistance region, which indicates an effective alpha equal to or slightly greater than unity.

In Fig. 3, the principal current paths through the transistor are indicated by the arrows 35, 36, 37, 38 and 39. In the embodiment illustrated, reverse bias is applied across the edges of both emitter junctions, even though it is essential only that one emitter junction be so biased. Currents flowing through the two intermediate layers, as shown, produce voltage drops which cause the reverse bias to be smaller at the point of the main current flow through the transistor, represented by arrow 35.

Voltage applied between terminals 31 and 32 causes the current path to shift from the center of the transistor toward the more negative one of these two terminals, whereas voltage applied between terminals 33 and 34 causes the current to shift toward the more positive one of these two. In each case, the current is shifting toward the emitter-junction edge having the smaller reverse bias.

It is evident that the external circuit can take a great variety of forms. As illustrated in Fig. 3, the external circuit comprises a battery or other voltage source 40 in series with two potentiometers 41 and 42 connected to electrodes 29 and 30, respectively. The battery 40 has a no-current voltage exceeding the breakdown voltage of the transistor, and thus it insures the flow of current, and the potentiometers 41 and 42 provide sufficient resistance to limit this current to a substantially constant value. Further, voltage drops across the two potentiometers provide the needed reverse-bias voltages for the emitter junctions. To this end, terminals 31 and 32 are connected to the two adjustable taps 43 and 44 of potentiometer 41, and the terminals 33 and 34 are connected to the two adjustable taps 45 and 46 of potentiometer 42.

Having achieved the focusing and lateral positioning of the current flow through the transistor, the useful applications of these principles and variations thereon are innumerable. Generally, there will be some output means responsive to the lateral position of the current path through the transistor. This may comprise a physical division of one or both of the two electrodes attached to the ends of the semiconductor plate, to form a plurality of laterally spaced electrodes or electrode pairs among which current (and signals) may be switched at will. Or, electro-optical transducers may be included in the structure, to provide image-scanning and image-display functions for television camera and picture devices, oscillograph presentation, and other purposes.

Figure 5:
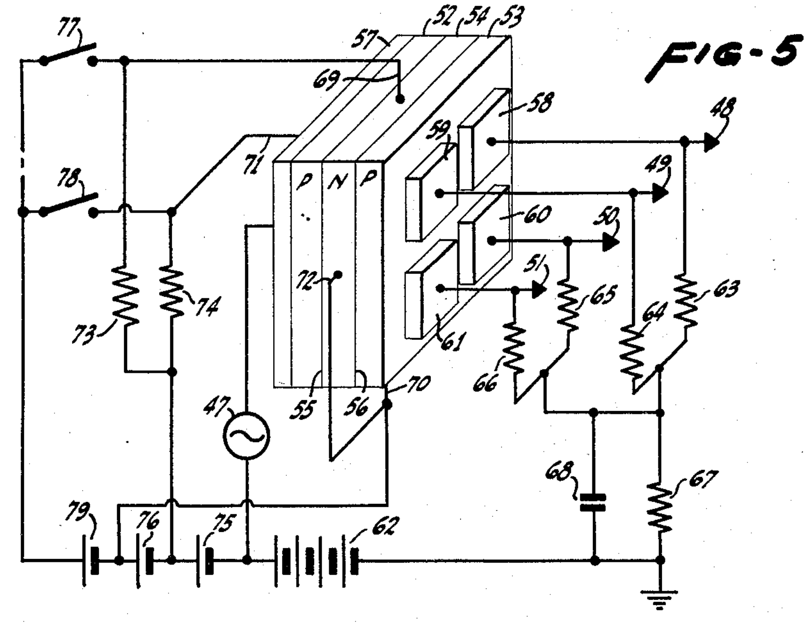
Fig. 5 is a schematic representation of the invention as applied to a signal-switching device.

Fig. 5 illustrates how the invention may be employed to switch an A.C. signal from source 47 to any one, selectively, of a plurality of output circuits 48, 49, 50 and 51. In the example illustrated, the transistor is of the P-N-P type having two P-type end layers 52 and 53 and an N-type intermediate or base layer 54. The emitter junction 55 lies between layers 52 and 54, and the collector junction 56 lies between layers 53 and 54.

An electrode 57 attached to one end of the transistor covers substantially the entire exposed area of layer 52. On the other end of the transistor, in contact with layer 53, there are four laterally spaced, quadrilaterally arranged electrodes 58, 59, 60 and 61. These four last-named electrodes are connected to the four output circuits 48, 49, 50 and 51, respectively.

A.C. signal-source 47 is connected in series with a voltage source 62 between electrode 57 and ground. The four electrodes 58, 59, 60 and 61 are connected through their individual load resistors 63, 64, 65 and 66, and through a common current-regulating resistor 67 in parallel with an A.C. bypass capacitor 68, to the grounded negative terminal of voltage supply 62.

Supply 62 and limiting resistor 67 force a substantially constant average value of current through the transistor, which passes in the reverse direction across the collector junction 56. The instantaneous value of this current is modulated by the A.C. signal-source 47, whereby the A.C. signal appears across any selected one of the load resistors 63, 64, 65 and 66, depending upon the lateral position of the current through the transistor. Capacitor 68 presents a low impedance to the A.C. signal, and thus prevents any substantial portion of the output signal appearing across the common resistor 67.

Leads 69, 70, 71 and 72 are attached to respective ones of the four edges of base layer 54, the four base-layer terminal connections being spaced outward laterally in quadrivial relation from the center of the transistor as hereinbefore explained. These four leads are connected to a bias circuit which applies reverse bias across the edges of the emitter junction. The smallest reverse bias is applied to leads 69 and 71, through the resistors 73 and 74 connected to a first bias-voltage source 75. Leads 70 and 72 are connected directly to a source of somewhat greater bias voltage 76, and switches 77 and 78 are provided whereby leads 69 and 71 can be connected selectively, at will, to a source of still greater bias voltage 79.

With the two switches 77 and 78 open, as illustrated, the voltage between leads 69 and 70 shifts the current path through the transistor laterally upward, and the voltage between leads 71 and 72 shifts the same current path laterally inward toward the plane of the paper, so that the current flows between electrodes 57 and 58, and the A.C. signal appears across load resistor 63 and is directed to output circuit 48.

When switch 78 is closed, the polarity of the voltage between leads 71 and 72 is reversed, and the current path is shifted laterally outward with respect to the plane of the paper, so that current now flows between electrodes 57 and 59. Hence, the A.C. signal now appears across load resistor 64 and is directed to the output circuit 49.

If switch 77 is closed, while switch 78 remains open, the voltage between leads 69 and 70 is reversed, and it is apparent that the current path will be shifted to electrode 60. Now the output signal will appear across load resistor 65, and be directed to output circuit 50.

Similarly, when both of the switches 77 and 78 are closed concurrently, it is evident that the current path will be shifted to electrode 61 and that the A.C. signal will appear across load resistor 66 and be directed to the output circuit 51.

The device described can be adapted for almost all beam-switching applications that heretofore required the use of electron-beam vacuum tubes. The number of output electrodes is by no means limited to four: as many as desired can be utilized, limited only by manufacturing techniques. Furthermore, endless variations in the external circuitry are possible, and the applications are by no means limited to the switching of A.C. signals.

Figure 6:
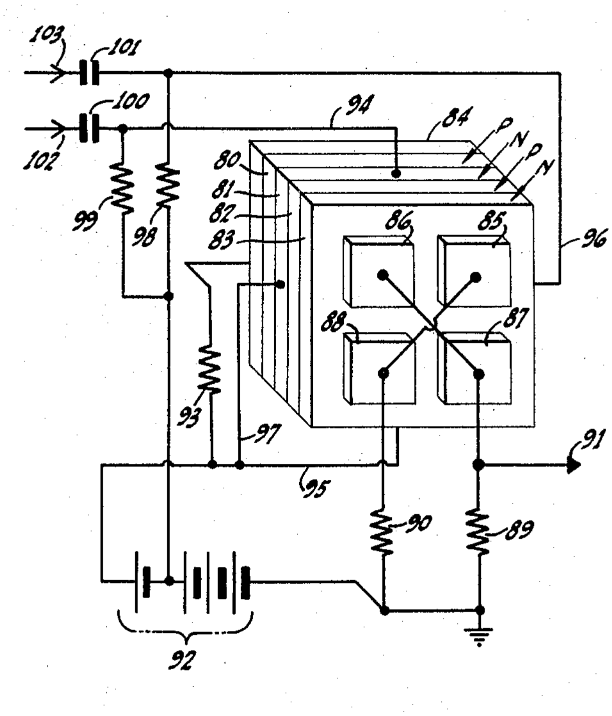
Fig. 6 is a schematic representation of the invention as applied to a logic or anti-coincidence device.

Fig. 6 illustrates how the principles of the invention may be applied to an anti-coincidence or logic circuit, which will provide an output signal whenever an input signal is received over either one of two inputs leads, but not over both concurrently. The embodiment illustrated in Fig. 6 utilizes a P–N–P–N transistor having four layers 80, 81, 82 and 83 of conductivity types P and N alternately. A large electrode 84 is attached to one end of the transistor, in electrical contact with a major portion of the area of end layer 80. Attached to the other end of the transistor, and in electrical connection with the end layer 83, there are four laterally spaced, quadrilaterally arranged electrodes 85, 86, 87 and 88. The last-mentioned four electrodes are connected together diagonally to two load resistors 89 and 90, as shown. Signals appearing across the resistor 89 are transmitted to the output circuit 91.

A substantially constant current is forced through the transistor, in the reverse direction across the collector junction between intermediate layers 81 and 82, by a voltage source 92 in series with a resistor 93 connected to the electrode 84. Four leads 94, 95, 96 and 97 are attached to the four edges of base layer 81, as shown. In this instance, base layer 82 lacks any external-circuit electrical connection. Leads 95 and 97 are connected directly to the most positive terminal of the voltage supply, so that the full value of the voltage drop across resistor 93 appears as a reverse bias across the edges of the emitter junction adjacent to the base-layer edges connected to these leads. Leads 94 and 96 are connected through resistors 98 and 99 to a somewhat less-positive tap of the voltage supply, so that the reverse bias across the corresponding edges of the emitter junction are somewhat smaller, whereby current normally flows through the transistor between electrodes 84 and 85.

Leads 94 and 96 are also connected through capacitors 100 and 101 to two separate input circuits 102 and 103, respectively. Upon receipt of a positive input pulse through input circuits 102 only, the voltage between leads 94 and 95 is reversed and the current path through the transistor is shifted downward to electrode 87, thereby providing an output pulse to output circuit 91. Similarly, whenever a positive pulse is received through input circuit 103 only, the voltage between leads 96 and 97 is reversed and the current path through the transistor is shifted to electrode 86, whereupon another output pulse is transmitted to the output circuit 91. However, if positive pulses are received simultaneously from input circuits 102 and 103, the current path is shifted to electrode 88, and no signal is delivered to the output circuit. Thus there is provided a circuit which may be used as an anti-coincidence circuit; or it may be used as a logic element in computing apparatus and the like, performing the logical function "OR but not AND." It is evident that a coincidence circuit, or a logical "AND" element, can be had by providing a separate output from electrode 88.

Figure 7:
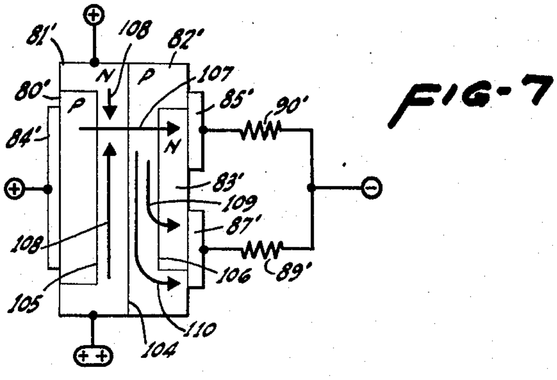
Fig. 7 is a schematic representation illustrating a design refinement.

Some further discussion of the voltage gradients in the "floating" intermediate layer 82 is in order. Referring to Fig. 7, the P–N–P–N junction transistor there illustrated has four layers 80′, 81′, 82′ and 83′, of conductivity types P and N alternately, as illustrated. There is a collector junction 104 between the two intermediate or base layers 81′ and 82′, and there are two emitter junctions 105 and 106, as illustrated. A single electrode 84′ is attached to one end of the transistor, and two laterally spaced electrodes 85′ and 87′ are attached to the other end of the transistor. The edges of emitter junction 105 are reverse-biased by positive potentials supplied to the edges of the intermediate layer 81′. The intermediate or base layer 82′ has no bias-circuit connections. Arrow 107 represents the path of principal current flow through the transistor, and this path may be shifted laterally by the application of transverse voltages across the base layer 81′, as hereinbefore explained. Currents from the external-circuit connections flow inward through base layer 81′, as represented by arrows 108.

Assume that the voltages applied to base layer 81′ are such that current flows between electrode 84′ and electrode 85′, as illustrated. Along the path 107 of current flow, there can be no more than a small voltage difference between layers 82′ and 83′. However, the voltage drop across load resistor 90′ must exceed that across load resistor 89′, and in consequence the emitter junction 106 tends to become forward biased in the vicinity of electrode 87′. Hence, current flows across this emitter junction, and flows transversely through the layer 82′ as represented by the arrow 109. The current flowing across the emitter junction will necessarily cause some current flow across adjacent portions of the collector junction 104.

This may be tolerable so long as current flow to electrode 87′ is below the "turn-on" current of the transistor section between electrodes 84′ and 87′. It can be significantly reduced, however, by permitting the electrodes 85′ and 87′ to overlap portions of the emitter junction 106, as illustrated, to provide an additional current path 110 for current flowing transversely through the layer 82′. In this way the necessary transverse voltage gradient in layer 82′ is maintained by the sum of the currents flowing in paths 109 and 110, whereas only the current flowing in path 109 crosses the emitter junction and thus causes the flow of undesired current across collector junction 104. Of course, another and even more effective solution is to reverse-bias the emitter junction 106 in the manner illustrated in Fig. 3, whether or not transverse voltages are applied to layer 82′ for the current-positioning purposes.

Figure 8:
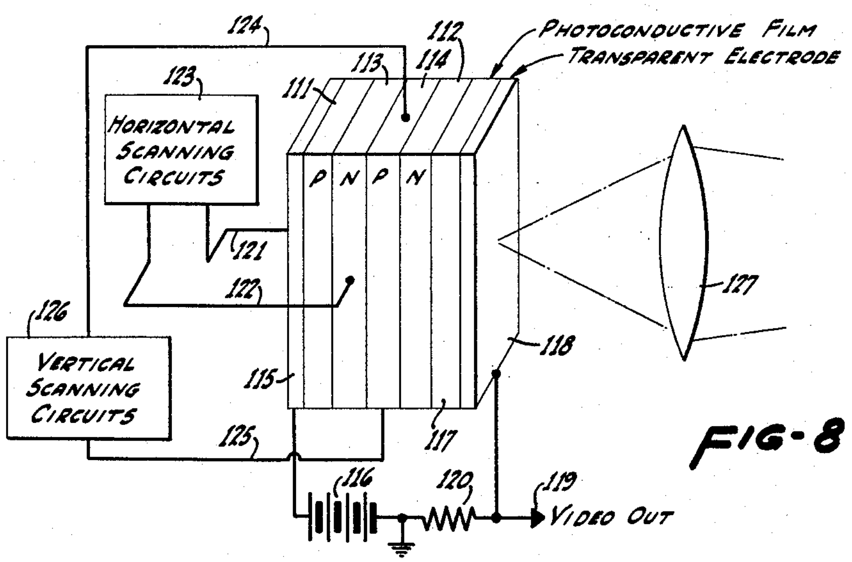
Fig. 8 is a schematic representation of the invention as applied to a television camera element.

Fig. 8 represents the application of this invention to a television camera element or the like. As in the previous embodiments, the transistor proper consists essentially of a plate of single-crystal semiconductor material appropriately processed to have three or more consecutive layers of conductivity types P and N alternately. In the embodiment illustrated, a P–N–P–N junction transistor is provided, in which there are two end layers 111 and 112 of opposite conductivity types, and two intermediate or base layers 113 and 114 of opposite conductivity types. The collector junction is between layers 113 and 114, and there are emitter junctions between layers 111 and 113 and between layers 112 and 114.

An electrode 115 attached to one end of the transistor, and in electrical contact with the major portion of layer 111, is maintained at a positive potential by voltage source 116. Attached to the other end of the transistor, and in contact with a major portion of layer 112, there is a photoconductor, which in the illustrated embodiment comprises a photoconductive film 117 and a transparent electrode 118. The film 117 may be of various known photoconductive materials, formed in ways well known to those skilled in the art. Electrode 118 may be formed, for example, by depositing over the film 117 a film of metal so thin as to be essentially transparent. Electrode 118 is connected to the video output 119 and through the load resistor 120 to the grounded negative terminal of voltage supply 116.

In operation, the voltage supply 116 forces through the transistor a current limited by the resistance of film 117 and resistor 120 in series. Because the current path through the transistor is focused to a small cross-section, as hereinbefore explained, and film 117 is relatively thin and is immediately adjacent to one end of the transistor, it can be considered that current passes essentially through only a small elemental area of film 117 at any given instant. The resistance of this elemental area of the photoconductive film, and therefore the amount of current flowing in the circuit, is a function of the amount of light directed onto the elemental area under consideration. Hence, as the current path is shifted laterally to scan the film, the voltage at output 119 varies according to point-to-point variations in the amount of light focused onto the film. In actual practice, there may be current flow through elemental areas of film 117 between scanning epochs, with storage effects due to charging and discharging of elemental capacitances between layer 112 and electrode 118, but this does not vitiate, and may enhance, the action described.

To complete the apparatus illustrated, leads 121 and 122 are connected to opposite edges of intermediate layer 113, for applying horizontally thereacross horizontal scanning voltages of the type conventionally used in television apparatus, which may be derived from essentially conventional, horizontal scanning circuits 123. Similarly, leads 124 and 125 are connected to opposite edges of base layer 114 and to the vertical scanning circuits 126, which apply vertically across layer 114 vertical scanning voltages of the type customarily employed in television. It will be understood that the scanning circuits apply to the base layers, in addition to the customary A.C. scanning voltages, appropriate values of D.C. bias to reverse-bias the edges of the emitter junctions in the manner hereinbefore explained.

It is evident that the arrangement illustrated and described results in the scanning of photoconductive film 117 in the conventional pattern of a television scanning raster. A lens system 127 is employed to focus optical images of the scene viewed through transparent electrode 118 onto the photoconductive film 117. The output video signal is provided at 119.

Figure 9:
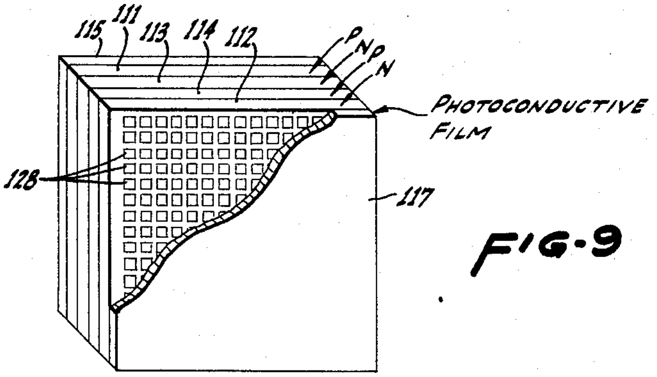
Fig. 9 represents a design refinement of the Fig. 8 device.

Generally, satisfactory electrical contact between layer 112 of the transistor and the photoconductive film 117 may be had simply by laying or depositing the film over one end of the transistor. An alternative means for providing electrical contact is illustrated in Fig. 9, wherein a portion of the photoconductive film has been cut away to illustrate the end face of the transistor. A large number of individual, metallic contacts are made to layer 112 by depositing thereon a mosaic of metallic-film dots 128. This is easily done, for example by photoengraving methods. The film 117 can then be deposited over the metallic mosaic, and if desired the metal can be alloyed to the adjacent layers by controlled heat-treatment, as is well known.

Figure 10:
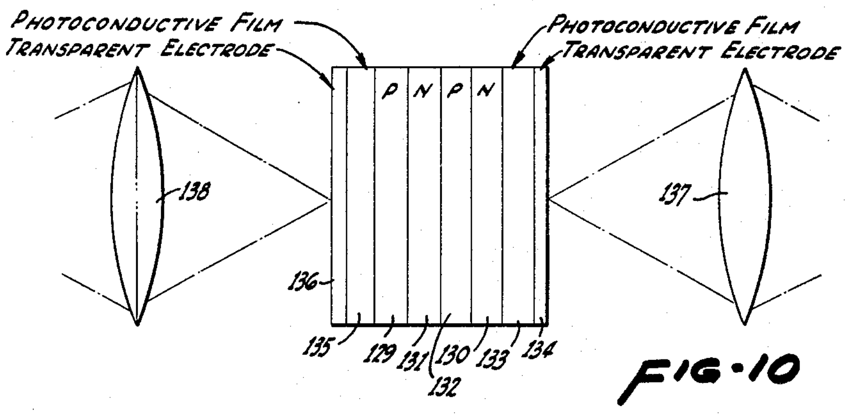
Fig. 10 is a schematic representation of a modification of the Fig. 8 device for the purpose of combining two images.

The improved scanning device can not only replace conventional electron-beam vacuum-tube devices with simpler and more compact solid-state structures, but also is capable of functioning in novel ways not readily duplicated by prior art structures. In Fig. 10, there is shown a modification of the solid-state television camera element, which is capable of combining optical images in a unique and useful manner. In the embodiment illustrated, a P-N-P-N switching transistor is employed, having end layers 129 and 130 and intermediate or base layers 131 and 132. The photoconductive film 133 and the transparent electrode 134 correspond to film 117 and electrode 118 of the embodiment illustrated in Fig. 8; however, in Fig. 10 the electrode at the other end of the transistor has been replaced by a second photoconductive film 135 and transparent electrode 136. A lens system 137 focuses an optical image onto photoconductive film 133, and another lens system 138 focuses a second optical image onto photoconductive film 135. The principal current path through the transistor is between electrodes 134 and 136, and passes through the two films 133 and 135 in series. Otherwise, the electrical connections of the transistor may be identical to those illustrated in Fig. 8.

In the embodiment shown in Fig. 10, the two photoconductive films 133 and 135 are scanned simultaneously, and the instantaneous current is a function of the sum of the resistances of corresponding elemental areas in the two films. Hence, the output electric signal represents a composite of the two optical images.

As an example of how this may be used, assume that lens 137 projects onto film 133 the image of a scene viewed as in any conventional television camera. Further, assume that lens 138 projects onto film 135 the image of a prepared pattern of light and shadow, wherein the white or light portions represent the areas within which the picture projected onto film 133 is to be transmitted, whereas the dark or black areas represent areas of the picture that are to be masked or blanked out. Since film 135 will have a high resistance, and limit current through the transistor to a low value, in the dark areas of the image projected onto film 135, it is evident that the desired masking effect will be obtained.

Figure 11:
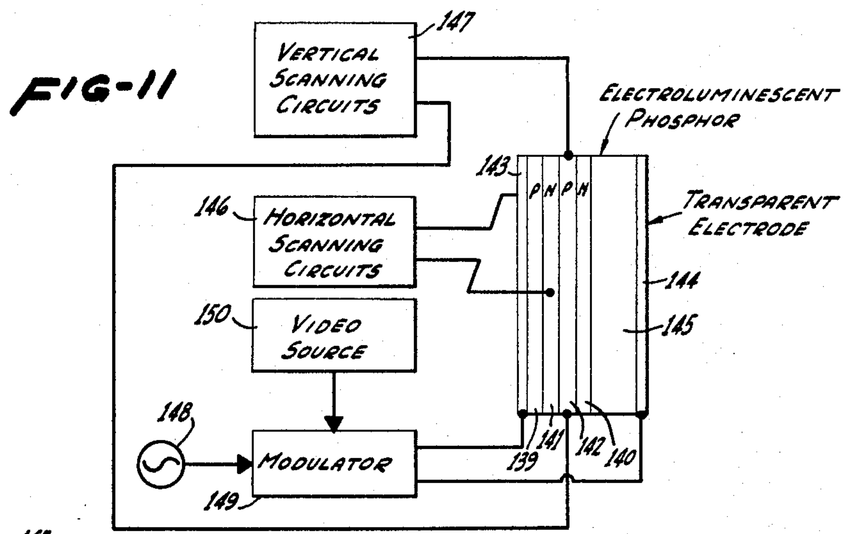

Fig. 11 represents an image-display device, which can be used to display small television images, or for the display of oscillograms or computing-machine data, and for other purposes. In general, the display device consists essentially of one of the scanning transistors hereinbefore described connected in series with an electro-responsive light-emitter. In the embodiment illustrated in Fig. 11, the light-emitter is an electro-luminescent phosphor which emits light in proportion to the alternating current applied thereto.

In Fig. 11, the transistor illustrated is of the P-N-P-N type having end layers 139 and 140 and intermediate or base layers 141 and 142. Attached to one end of the transistor and in electrical contact with the major portion of layer 139 is an electrode 143. Sandwiched between the other end of the transistor and a transparent electrode 144 there is a plate of electro-luminescent phosphor material 145, which is in electrical contact with end layer 140 of the transistor and with the electrode 144. Horizontal scanning circuits 146 supply to base layer 141 bias and scanning voltages as hereinbefore described, and vertical scanning circuits 147 apply the appropriate bias and scanning voltages to base layer 142, so that the current path through the transistor scans the phosphor plate 145 in accordance with a conventional television scanning raster, Alternating current of appropriate frequency for exciting the electro-luminescent phosphor is applied between electrodes 143 and 144 from an A.C. source 148 through a modulator 149, which modulates the amplitude of the alternating current in accordance with a video signal supplied by video source 150. As a result, each elemental area of the phosphor plate is excited to an extent controlled by the signal from video source 150, and there is formed an image which can be viewed through the transparent electrode 144.

Figure 12:
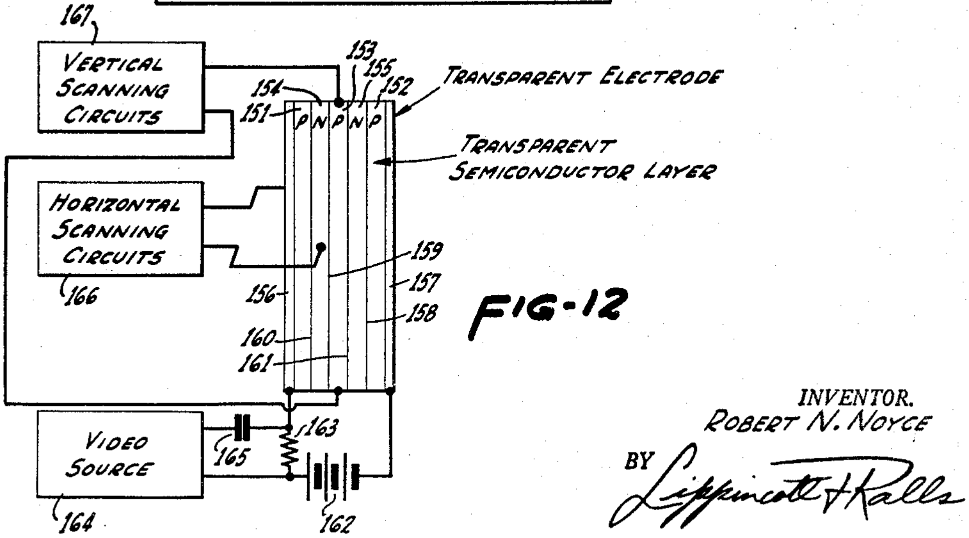

It is also possible to use semiconductor junctions as photosensitive elements in camera devices, and as light-emitters for display devices. Fig. 12 illustrates the use of a reverse-biased N-P junction as the light-emitter in a display device. A plate of single-crystal semiconductor material e.g., silicon of appropriate dimensions—say, a few mils thick and one-half inch square—is processed by known means to form therein five consecutive layers of conductivity types N and P alternately. In the specific embodiment illustrated, the two end layers 151 and 152 are P-type, the middle layer 153 is also P-type, and the two remaining layers 154 and 155 are N-type. Electrodes 156 and 157 are attached to opposite ends of the transistor, in electrical contact with major portions of layers 151 and 152, respectively.

In this embodiment, layer 152 and electrode 157 are both transparent, so that light generated at the junction 158 can pass readily through layer 152 and electrode 157 and can be thus observed. Basically, this transparency is accomplished by making the layer 152 and the electrode 157 sufficiently thin, though evidently a suitable choice of materials for transparency—e.g., silicon carbide absorbs less visible light than silicon, and permits relatively easy observation of the emitted light—may also be a design factor in some cases.

In operation, the four layers exclusive of end layer 152 constitute a P-N-P-N switching transistor which operates essentially as hereinbefore described for the focusing and lateral positioning of the current path through the semiconductor material. Thus, insofar as the transistor proper is concerned, layers 151 and 155 are the end layers, and layers 153 and 154 are the intermediate layers. The junction 159 between layers 153 and 154 is a collector junction, and the two adjacent junctions 160 and 161 are emitter junctions.

Reverse current is forced across the collector junction 159, and through the entire semiconductor structure, by a voltage supply 162 in series with a current-limiting resistor 163. The strength of this current is modulated by a video source 164 which is connected across the resistor 163 through a coupling capacitor 165. The current path is shifted laterally over a conventional television scanning raster by means of horizontal scanning circuits 166 connected across opposite edges of base layer 154, and vertical scanning circuits 167 connected across opposite edges of the base layer 153. Thus, in operation the junction 158 is repetitively scanned in the pattern of a television scanning raster, and the strength of the current crossing the junction at each elemental point is controlled by the video source 164.

It will be noted that the current through the composite structure crosses junction 158 in the reverse or high-resistance direction. With appropriate design according to known principles, such reverse current flow across a P-N junction of appropriate semiconductor material—e.g., silicon or silicon carbide—emits sufficient light to be readily visible. In this case, since current strength varies from point-to-point over the area of the junction in accordance with the control exercised by video source 164, an optical image is created at junction 158. This can be observed through the transparent electrode 157 and the transparent semiconductor layer 152.

The structure illustrated in Fig. 12 is reciprocal, in that essentially the same structure can also be used to convert an optical image into a video signal. That is, light directed onto junction 158 through the transparent electrode 157 and transparent semiconductor layer 152 increases the conductivity of the junction. Hence, if the video source 164 is omitted, and an optical image is focused upon junction 158 while the scanning circuits are operated in the usual manner, a video signal representative of the optical image will appear across resistor 163.

It will be understood that the embodiments described are merely exemplary of the innumerable useful applications for and variations in the novel and inventive principles herein disclosed.

What is claimed is:

1. A solid-state electrical device, comprising a junction transistor having substantially parallel emitter and collector junctions with a base layer of extrinsic material therebetween, circuit means for forcing across said collector junction a flow of reverse current sufficient to make the transistor alpha exceed unity, circuit means for applying a reverse bias across the edges of said emitter junction, whereby said current is confined to a path of small cross-section relative to the areas of said junctions, circuit means for applying a variable voltage laterally across said base layer for varying the lateral position of said current path, and output means responsive to the lateral position of said current path.

2. A device as in claim 1, wherein said transistor is a plate of single-crystal, semiconductor material having two substantially flat, parallel faces, and having therein at least three substantially flat, parallel layers of conductivity types P and N alternately, with the emitter and collector junctions therebetween substantially parallel to said faces.

3. A device as in claim 1, wherein the circuit means for varying the lateral position of the current path comprises four base-layer terminals spaced outward laterally in quadrivial relation from the center of the transistor, means for applying a first independently variable voltage between two opposite ones of said terminals, and means for applying a second independently variable voltage between the other two opposite ones of said terminals, whereby the lateral position of said current path is bidirectionally variable.

4. A device as in claim 1, wherein said transistor is a plate of semiconductor material having two substantially flat, parallel faces, and having therein four substantially flat, parallel, consecutive layers of conductivity types P and N alternately, forming two end layers of opposite conductivity types, with the collector junction between the two intermediate layers.

5. A device as in claim 4, wherein the circuit means for varying the lateral position of the current path comprises four terminals attached to said intermediate layers and spaced outward laterally in quadrivial relation from the center of the transistor, two opposite terminals attached to one of said intermediate layers constituting a first pair of said terminals and two opposite terminals attached to the other of said intermediate layers constituting a second pair of said terminals, and means for applying two independently variable voltages across said first pair and said second pair respectively.

6. A device as in claim 1, wherein the output means comprises a photoconductor adjacent to one end of said transistor and electrically in series therewith, so that said photoconductor is scanned laterally by lateral movement of the current path responsive to said variable voltage, and connections for providing an electric signal representation of the variations in conductivity of said photoconductor as it is so scanned.

7. A device as in claim 6, wherein said photoconductor comprises a transparent electrode, and a photoconductive film sandwiched between said electrode and one end of the transistor.

8. A device as in claim 1, wherein the output means comprises an electro-responsive light-emitter adjacent to one end of said transistor and electrically in series therewith, so that current flows through the transistor and light-emitter in series and said light-emitter is scanned laterally by lateral movement of the current path responsive to said variable voltage.

9. A device as in claim 8, additionally comprising means for supplying a video signal, and circuit means for modulating the strength of said current in accordance with said signal.

10. A device as in claim 8, wherein said light-emitter comprises a transparent electrode, and a plate of electroluminescent phosphor sandwiched between said electrode and one end of the transistor.

11. A device as in claim 8, wherein said light-emitter comprises means defining an additional P-N junction electrically in series with said transistor and oriented so that said current flows thereacross in the high-resistance direction.

12. A device as in claim 1, wherein said transistor and output means are comprised in a plate of semiconductor material having two substantially flat, parallel faces and having therein five substantially flat, parallel, consecutive layers of conductivity types P and N alternately, forming therebetween four substantially flat, parallel P-N junctions, an end one of said layers being transparent and located at one of said faces so that the immediately underlying P-N junction can act effectively as a photoelectric transducer, the other three junctions acting as P-N-P-N transistor junctions with the collector junction between two emitter junctions.

13. A device as in claim 1, wherein said transistor is a plate of semiconductor material having two substantially flat, parallel faces, and having therein three substantially flat, parallel, consecutive layers of conductivity types P and N alternately, forming two end layers of the same conductivity type and a sole, intermediate, base layer of the other conductivity type, with the collector junction between said base layer and one of said end layers, and the emitter junction between said base layer and the other of said end layers.

14. A device as in claim 13, wherein the circuit means for varying the lateral position of the current path comprises four terminals attached to said base layer and spaced outward laterally in quadrivial relation from the center of the transistor, two opposite ones of said terminals constituting a first pair and the other two opposite ones constituting a second pair of said terminals, and means for applying two independently variable voltages across said first pair and said second pair respectively.

15. A device as in claim 1, wherein the output means comprises a plurality of electrically separate, laterally spaced electrodes attached to an end of the transistor, so that lateral movement of the current path responsive to said variable voltage transfers said current from one to another of said electrodes.

16. A device as in claim 15, additionally comprising means for providing an electric signal, circuit means for modulating the strength of said current in accordance with said signal, and a plurality of load circuits connected to respective ones of said electrodes, so that said signal can be transmitted to various ones of said load circuits, selectively, under control of said variable voltage.

17. A device as in claim 1, wherein said transistor is a plate of semiconductor material having two substantially flat, parallel faces, and having therein four substantially flat, parallel, consecutive layers of conductivity types P and N alternately, forming two end layers of opposite conductivity types and two intermediate layers of opposite conductivity types, with the collector junction between the two intermediate layers, and wherein the circuit means for varying the lateral position of the current path comprises four terminals attached to one of said intermediate layers and spaced outward laterally in quadrivial relation from the center of the transistor, two opposite ones of said terminals constituting a first pair and the other two opposite ones constituting a second pair of said terminals, and means for applying two independently variable voltages across said first pair and said second pair respectively.

18. A device as in claim 1, wherein the output means comprises four quadrilaterally spaced electrodes attached to one end of the transistor and an output lead circuit connected to a diagonally disposed first pair of said electrodes, the other two of said electrodes constituting a second pair, and wherein the circuit means for varying the lateral position of the current path comprises four base-layer terminals spaced outward laterally in quadrivial relation from the center of the transistor, circuit means for applying to said terminals bias voltages for directing said current to one of the electrodes of said second pair, and circuit provisions for applying two independent input electric signals to said terminals in quadrivial relation and in a sense that each input signal tends to shift the current path to a different electrode of said first pair, whereby an output signal is supplied to said load circuit responsive to either of said input signals, but not to both concurrently.

19. A junction transistor device consisting essentially of a plate of single-crystal, semiconductor material having two substantially flat, parallel faces, and having therein at least three substantially flat, parallel, consecutive layers of conductivity types P and N alternately, each of said layers having large lateral dimensions relative to the thickness of said plate and lying substantially parallel to said faces, there being two end layers and at least an intermediate layer, conductive elements attached to said faces in electrical contact with said two end layers, electrical terminals attached to edges of an intermediate layer for the application of a first voltage lateral thereto, and other electrical terminals attached to edges of an intermediate layer for the application of a second voltage lateral thereto non-parallel to said first voltage.

20. A transistor device as in claim 19, wherein there are three of said layers, including only one intermediate layer.

21. A transistor device as in claim 19, wherein there are four of said layers, including two intermediate layers with a collector junction therebetween.

22. A transistor device as in claim 21, wherein there are four of said terminals in quadrivial relation attached to one intermediate layer.

23. A transistor device as in claim 21, wherein two opposite ones of said terminals are attached to one of said intermediate layers, and another two opposite ones of said terminals are attached to the other one of said intermediate layers.

24. A transistor device as in claim 19, wherein there are five of said layers, at least one of the end layers is transparent, and the one of said conductive elements in contact with the transparent end layer is likewise transparent.

References Cited in the file of this patent

UNITED STATES PATENTS 2,790,037 Shockley -------------- Apr. 23, 1957